United States Patent [19]
Seitz et al.

[11] Patent Number: 5,936,866
[45] Date of Patent: Aug. 10, 1999

[54] LIGHT-DETECTION SYSTEM WITH PROGRAMMABLE OFFSET CURRENT

[75] Inventors: Peter Seitz, Kuesnacht; Oliver Vietze, Zurich, both of Switzerland

[73] Assignee: Leica AG, Heerbrugg, Switzerland

[21] Appl. No.: 08/945,241

[22] PCT Filed: Sep. 3, 1996

[86] PCT No.: PCT/EP96/03851

§ 371 Date: Oct. 23, 1997

§ 102(e) Date: Oct. 23, 1997

[87] PCT Pub. No.: WO97/09819

PCT Pub. Date: Mar. 13, 1997

[30] Foreign Application Priority Data

Sep. 7, 1995 [DE] Germany ............ 195 33 061

[51] Int. Cl.$^6$ ........................................ H01L 27/00
[52] U.S. Cl. .................... 364/490; 257/213; 257/225; 250/200; 250/206
[58] Field of Search ................... 257/257, 226, 257/234, 236, 292, 290, 147, 260, 264, 213, 215, 225; 327/208, 509; 364/488, 489, 490; 250/200, 206

[56] References Cited

U.S. PATENT DOCUMENTS

| | | | |
|---|---|---|---|
| 4,427,990 | 1/1984 | Nishizawa | 257/258 |
| 4,723,221 | 2/1988 | Matsuura et al. | 364/490 |
| 4,839,735 | 6/1989 | Kyomasu et al. | 257/290 |
| 4,847,483 | 7/1989 | Nishibe et al. | 250/214 AL |
| 5,019,876 | 5/1991 | Nishizawa | 257/147 |
| 5,241,575 | 8/1993 | Miyatake et al. | 257/226 |
| 5,276,407 | 1/1994 | Mead et al. | 330/308 |
| 5,336,936 | 8/1994 | Allen et al. | 327/208 |
| 5,376,813 | 12/1994 | Delbruck et al. | 257/288 |
| 5,528,059 | 6/1996 | Isogai | 257/257 |
| 5,661,317 | 8/1997 | Jeong | 257/257 |

FOREIGN PATENT DOCUMENTS

| | | |
|---|---|---|
| 37 43 954 | 7/1988 | Germany . |
| 2 222 738 | 3/1990 | United Kingdom . |

OTHER PUBLICATIONS

H. Akimoto et al., "Lateral Overflow–gate Shutter for CCD Image Sensors", SPIE High–Resolution Sensors and Hybrid Systems, vol. 1656, (1992) pp. 550–557.

S. Chen et al., "Adaptive Sensitivity™ CCD Image Sensor", SPIE, vol. 2415, pp. 302–309.

W. Yang, "Analog CCD Processors for Image Filtering", SPIE Visual Information Processing: From Neurons to Chips, vol. 1473 (1991), pp. 114–127.

E. Fossum et al., "Infrared Readout Electronics for Space Science Sensors: State of the Art and Future Directions", SPIE Infrared Technology XIX, vol. 2020 (1993), pp. 262–285.

C. Mead, "Transisto Physics", Analog VLSI and Neural Systems, Addison–Wesley Publishing Company, Chapter 3, (1989) pp. 32–41.

*Primary Examiner*—John Barlow
*Assistant Examiner*—Bryan Bui
*Attorney, Agent, or Firm*—Foley & Lardner

[57] ABSTRACT

A photoelectric semiconductor light-detection system with programmable dynamic performance includes a semiconductor photocell, preferably a photodiode, by which the impinging light intensity can be converted into a proportional photoelectric current. The drain of a first MOS FET of corresponding channel-type operated to saturation is coupled to the semiconductor photocell, e.g., the cathode or anode of the photodiode, and its source is maintained at a constant potential. A second MOS FET applies a predetermined variable charge amount to the gate of the first MOS FET. A capacitor is provided at the gate of the first MOS FET. The difference between the offset current and the photoelectric current can be integrated by an integration device. A third MOS FET can be operated as a switch to read the integration device and to reset it at a given value.

8 Claims, 2 Drawing Sheets

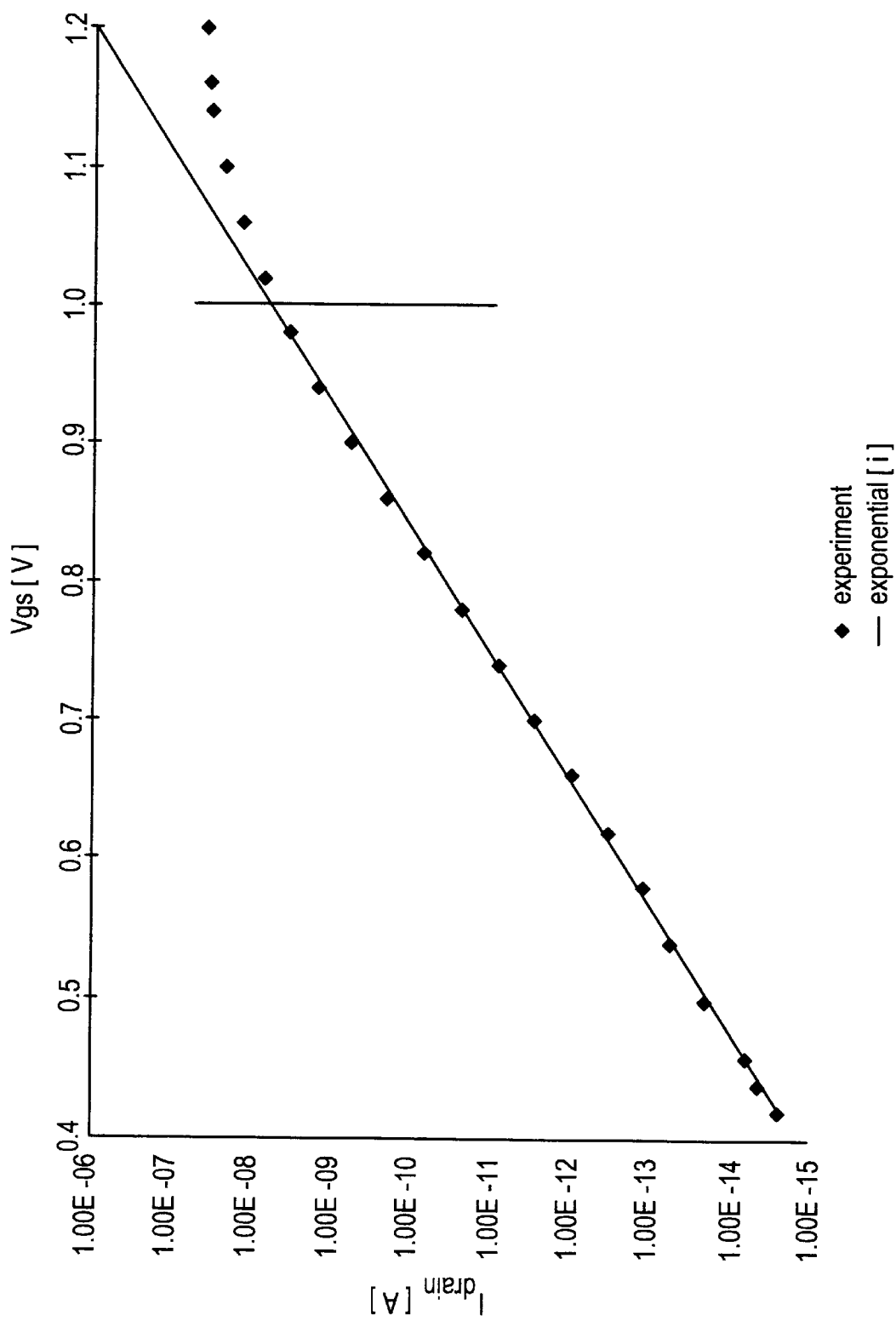

LIGHT-DETECTION SYSTEM WITH PROGRAMMABLE OFFSET CURRENT

BACKGROUND

The invention relates to a photoelectric semiconductor light-detection device having high dynamic range by virtue of a programmable offset signal.

One known method of reducing the sensitivity of photoelectric semiconductor light-detection devices overall, that is to say for all the pixels at the same time, is the so-called electronic shutter, as described, for example, by H. Akimoto, H. Ono, M. Nakai, A. Sato, T. Sakai, M. Maki, M. Hikiba and H. Ando in "Lateral overflow-gate shutter for CCD image sensors", Proc. SPIE, vol. 1656, pp. 550–557 (1992). In this case, an electronic switch is opened only for a fraction of the integration time, that is to say for the so-called exposure time, to integrate the charge carriers produced by photons. The sensitivity of all pixels can thereby be reduced simultaneously by the integration time/exposure time factor.

A method which makes it possible to use this on/off switching technique individually for the individual pixels of an image sensor has been described by S. Chen and R. Ginosar in "Adaptive sensitivity CCD image sensor", Proc. SPIE, vol. 2415, SUM. 303–309 (1995). In this technique, however, all the pixels are driven at high speed and repeatedly during the image acquisition. This technique cannot therefore be used in practice for relatively large image sensors having hundreds of thousands of pixels.

A known technique of subtracting an offset quantity of charge from an integrated quantity of charge, produced by photons, is the so-called "fill-and-spill" method in CCD technology, as described by W. Yang in "Analog CCD processors for image filtering", Proc. SPIE, vol. 1473, SUM. 114–127 (1991). In this case, a potential well is provided, the depth of which corresponds to the offset quantity of charge. Further to this, a potential well is provided, the depth of which corresponds to the quantity of charge produced by photons, and which is therefore somewhat deeper. When the potential wells are flooded with charge carriers, the somewhat deeper potential well retains a quantity of charge which is proportional to the difference in quantity of charge between the offset quantity of charge and the photocharge. This technique works reliably only in the case of a difference in quantity of charge which is in the percent range of the offset quantity of charge.

Another known technique is based on the use of a current-store element in the feedback circuit of a charge amplifier, that is to say of an operational amplifier having a capacitor in the feedback circuit. This has been described by E. R. Fossum and B. Pain in "Infrared Readout Electronics for Space Science Sensors: State of the Art and Future Directions", Proc. SPIE, vol. 2020, pp. 262–285 (1993). Since a current source is connected in parallel with the integration capacitor, the quantity of charge actually integrated is given by the difference between the quantity of charge produced by photons less an offset quantity of charge which is delivered by this current source. This publication describes that by using this technique for infrared sensor technology, effective compensation of the background infrared sensor technology, effective compensation of the background current and of the fixed pattern noise was achieved, albeit with considerable outlay of circuitry. For voltages across the capacitor which are small in comparison with kT/e, that is to say for a few tens of mV, a transistor can no longer be operated in the saturation range, and nonlinearities are to be expected with this technique.

SUMMARY OF THE INVENTION

The object of the invention is to further develop a photoelectric semiconductor light-detection device in such a way that the offset current can be programmed in photoelectric semiconductor light-detection devices having high dynamic range.

This object is achieved according to the invention by the features specified below.

The invention advantageously makes it possible for the sensitivity of the semiconductor light-detection device to be reduced, and thereby matched to the large dynamic range to be picked up. When a plurality of semiconductor light-detection devices are provided, this can be carried out individually in programmable fashion for each semiconductor light-detection device. The semiconductor light-detection device according to the invention is distinguished by a high degree of linearity.

Advantageous developments of the subject of the invention are also described below.

In the photoelectric semiconductor light-detection devices according to the invention, the offset current is adjustable and can be selected over more than seven orders of magnitude.

The photoelectric semiconductor light-detection device according to the invention consists, in the simplest embodiment, of only one photodiode, three transistors and one capacitor. It is thereby possible for a multiplicity of such photoelectric semiconductor light-detection devices to be combined in simple fashion to form one-dimensional and two-dimensional image sensors. There is in this case no fundamental limit for the maximum size of the sensor. The minimum area of the offset photodiode pixels is only insignificantly greater than conventional, not offset-programmable photodiode pixels. This provides a very effective means of balancing out nonuniformaties of the individual pixels between one another and increasing the dynamic range of the image sensor in a programmable fashion and as required by the problem to a multiple of the known values.

According to one embodiment of the invention, the described arrangement of photodiode and programmable offset current source is followed by a known evaluation device for analyzing periodic signals. In this device, the invention replaces the known AC coupling of signals, which have a small modulation depth, i.e. modulation amplitude, by making it possible for a large part of the background signal to be subtracted. In this form, the invention can be used anywhere in optical metrology where periodic oscillating processes are to be analyzed and signals with very small modulation depth occur. In these cases, a significantly larger electrical modulation depth can be achieved with the invention. Examples of such applications include all measuring methods which are based on the use of pulsed, i.e. time-modulated light sources. Examples include time-of-flight measurements for optical distance measurement.

The invention also makes it possible to acquire one-dimensional and two-dimensional time-varying image data with high dynamic range. In this case, the dynamic range of the signals is reduced as a function of time and position by suitably selecting and programming the offset currents, so that it is necessary to measure only a large number of small charge differences. Typical applications include electronic photography, video technology and optical metrology, where a high dynamic range and strong background signals occur.

The invention can advantageously be used in all fields where electromagnetic radiation is to be detected by photoelectric semiconductor light-detection devices, and a high dynamic range is required. In this context, the term dynamic range means the ratio between the maximum detectable radiation to the minimum detectable radiation.

In particular, photoelectric semiconductor light-detection devices according to the invention can be assembled to form a one-dimensional or two-dimensional multiple arrangement, which provides a linear or image sensor having an extremely high dynamic range. The individual photoelectric semiconductor detection devices can be programmed individually.

A further advantageous application of the invention relates to the acquisition of image data in the visible and near infrared spectral ranges, for example for video technology. It is known that image data of natural scenes occur with a very large dynamic range.

A further field of application for the invention is that of infrared sensors, in which context the image data are often subject to a large background signal, and the primary measured data are, in final analysis, merely the difference from this background due to local temperature differences.

A further field of application for the invention relates to optical metrology in which modulated light distributions occur which are subject to a large background which is irrelevant to the measurement task and is merely disruptive.

Further, the invention can be used to improve signals with photoelectric light-detection elements which, on account of the detection principle or deficiencies during production, have a large background (for example offset current or small leakage resistance) which interferes with the measurement.

A further field of application concerns measuring techniques which are based on the detection of light diffusely back-scattered from objects which lie within wide distance limits in variable ambient light. Since the intensity of the back-scattered light decreases approximately as the square of the distance of the object, but the background light remains, to first approximation, invariant in the short term, the invention can be used to compensate for the background light, it being possible to substantially increase the dynamic range of the signal light detection.

BRIEF DESCRIPTION OF THE DRAWINGS

The subject of the invention will explained in more detail below with the aid of embodiments with reference to the drawings, in which:

FIG. 3 shows the profile of the current through the first MOS field-effect transistor as a function of its gate voltage.

DETAILED DESCRIPTION

Figure 1:
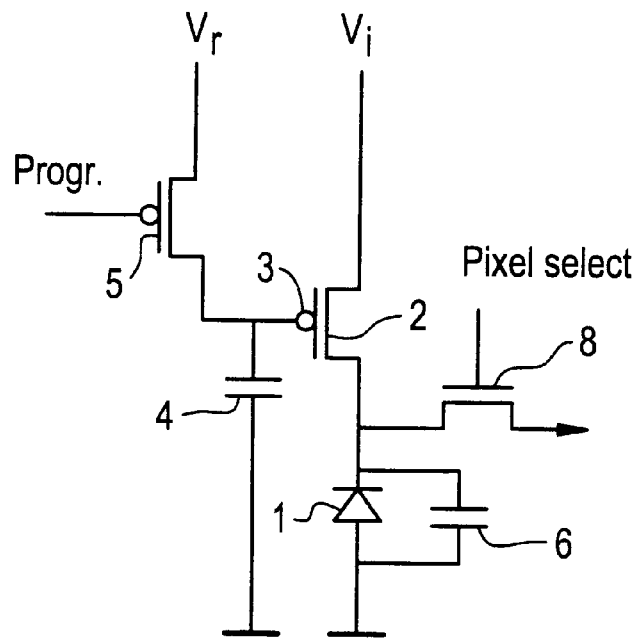
FIG. 1 shows a first embodiment of the invention.

In the embodiment represented in FIG. 1, a photoelectric semiconductor light-detection device has a semiconductor photocell in the form of a photodiode 1, which converts an incident light intensity into a proportional photocurrent density. This photocurrent density is, as known in this technical field, a strictly linear function of the incident light intensity over from 8 to 10 orders of magnitude. The cathode of the photodiode 1 is connected to the drain of a MOS field-effect transistor 2. A voltage $V_i$ which is considerably greater than kT/e is applied between the source and drain of this MOS field-effect transistor, k being Boltzmann's constant, T being the absolute temperature and e being the elementary charge. The MOS field-effect transistor is therefore operated in a state which is referred to as saturation (cf. C. A. Mead, "Analog VLSI and Neural Systems", Addison, Wesley, Reading (1989)). In this case, the current through the MOS field-effect transistor depends substantially not on the voltage difference between the source and the drain, but only on the gate-source voltage. The slight deviation from the ideal behavior of this current source, referred to in the literature as the Early effect, is of only secondary importance for the mode of operation of this embodiment according to the invention, since the variation in voltage at the drain of the MOS field-effect transistor in the case of a photodiode as a semiconductor photocell increases only logarithmically with the light intensity.

If a voltage is applied to the gate 3 of this MOS field-effect transistor 2, then for a gate voltage of up to a few hundreds of millivolts, a current flows which depends exponentially on the gate voltage. This range is referred to as the sub-threshold region. At a typical voltage of somewhat less than 1 volt, the current-voltage characteristic flattens out and the increase in current then depends only on the square of the gate voltage. This provides a programmable voltage source, using which an offset current in the range of from fA to microamps or more can be set for the corresponding pixel by means of the gate voltage. In this regard, reference may be made to FIG. 3.

Instead of the represented embodiment with a photodiode 1 in combination with a p-channel MOS field-effect transistor at the cathode of the photodiode 1, a possible alternative is an n-channel MOS field-effect transistor with the anode of the photodiode 1, with appropriate selection of the voltages.

The voltage required at the gate 3 can be stored in two ways. One possibility consists of a storage capacitor 4 which may in each case be connected via a programming MOS field-effect transistor 5 to a voltage source $V_r$. Another possibility in which the programmed voltage value can be maintained for a longer period of time, consists in designing the gate 3 as a so-called floating gate, to which analog quantities of charge can be applied by tunneling currents.

This principle is known from the field of electrically programmable memory components (EEPROMSs) (cf. U.S. Pat. No. 5,336,936 by T. P. Allen and J. B. Cser, entitled "One-transistor adaptable analog storage element and array", which was granted on Aug. 9, 1994). When this technique is used, driving is carried out using a programmer MOS field-effect transistor 5, but this does not have any direct electrical contact with the gate 3, but is only connected to the gate 3 via a thin gate oxide.

The readout driving of the storage capacitor, individually for the pixel, is carried out using the third MOS field-effect transistor 8, by correspondingly driving its gate. This can be done at the same time or sequentially. In this way it is possible for each current source of the individual pixels to be programmed with its own offset current.

At the output of the photodiode, a signal current is therefore available which is equal to the difference between the photocurrent and the individually programmed offset current. This signal current can be integrated using known techniques to form the desired signal. In the simplest case, the junction capacitance (6) of the (reverse-biased) photodiode 1 is used for this.

Figure 2:
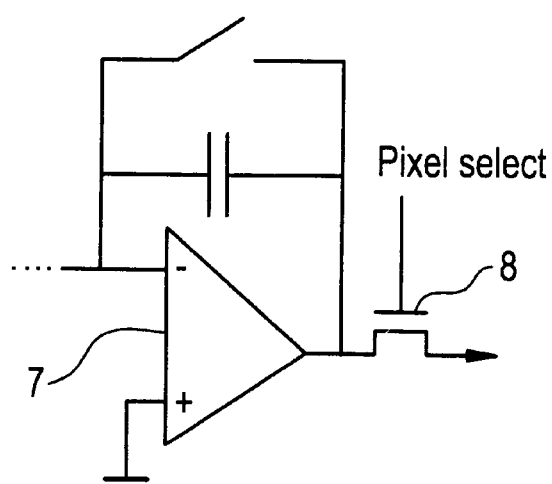
FIG. 2 shows a possible signal readout form of the invention.

It is, however, also possible, as has been described, according to FIG. 2 to use a resettable charge integrator 7, which provides the advantage of reducing the sensitivity of the photoelectric light-detection device to small parallel resistances, as are known to occur in photoelectric light-detection devices in the long wavelength range. Further known embodiments for integrating the difference in current, as are known from the prior art, are described, for example, in the already described publication by E. R. Fossum and B. Pain.

The reading and resetting of the integration capacitance, or integration capacitances is carried out using a known readout transistor 8 which periodically connects a readout line to the individual pixels. By means of this readout line, the signal charge can flow away and is registered using known detection circuits. As an alternative, initial impedance conversion of the charge signal may also take place at the site of the pixel using known techniques, which are used in the field of active pixel sensors (APS). It is thereby also possible to achieve a reduction in the output noise level.

What is claimed is:

1. A photoelectric semiconductor light-detection device having a high dynamic range by virtue of a programmable offset signal, comprising:
    a semiconductor photocell, by which light intensity incident on it can be converted into a proportional photocurrent,
    a first MOS field-effect transistor (2) of the corresponding channel type operated in saturation, the drain of the first MOS field-effect transistor coupled to the semiconductor photocell (1) and the source kept at a constant potential,
    a second MOS field-effect transistor (5), by which a predetermined variable quantity of charge can be applied to the gate of the first MOS field-effect transistor (2) to produce an offset current from the first MOS field-effect transistor,
    a capacitor (4) provided at the gate (3) of the first MOS field-effect transistor (2),
    an integration device, to integrate the difference between said offset current and the photocurrent, and
    a third MOS field-effect transistor (8) which can be operated as a switch, and using which the integration device can be read and reset to a specific value.

2. A device according to claim 1, wherein the semiconductor photocell is a photodiode (1) whose cathode or anode is connected, depending on the channel type of the first MOS field-effect transistor, to the drain of the latter.

3. A device according to claim 1, wherein the capacitor (4) provided at the gate (3) of the first MOS field-effect transistor (2) is an integrated capacitor with direct connection to the second MOS field-effect transistor (5).

4. A device according to claim 1, wherein the capacitor (4) provided at the gate (3) of the first MOS field-effect transistor (2) is a floating gate capacitor without direct electrical connection to the second MOS field-effect transistor (5).

5. A device according to claim 2, wherein the difference in current is integrated on the junction capacitance of the photodiode (1) or in a charge integrator (7).

6. An image sensor device, wherein the image sensor device is constructed from a one-dimensional or two-dimensional multiple arrangement of photoelectric semiconductor light-detection devices according to claim 1.

7. An image sensor device according to claim 6, wherein a device is provided, using which each photoelectric semiconductor light-detection device is programmable individually,) at variable rate, with an offset current which is subtracted during the light detection.

8. An image sensor device according to claim 6, wherein all the photoelectric semiconductor light-detection devices are programmable with the same offset current.

\* \* \* \* \*